(12) United States Patent
Kwon et al.

(10) Patent No.: US 8,867,302 B2
(45) Date of Patent: Oct. 21, 2014

(54) DATA INPUT CIRCUIT

(75) Inventors: Kyoung Hwan Kwon, Seoul (KR); Tae Jin Kang, Yongin-si (KR); Sang Kwon Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 846 days.

(21) Appl. No.: 13/096,669

(22) Filed: Apr. 28, 2011

(65) Prior Publication Data
US 2012/0113728 A1 May 10, 2012

(30) Foreign Application Priority Data

Jun. 9, 2010 (KR) .................. 10-2010-0054316

(51) Int. Cl.
*G11C 8/18* (2006.01)
*G11C 7/22* (2006.01)
*G11C 7/10* (2006.01)

(52) U.S. Cl.
CPC .............. *G11C 7/1072* (2013.01); *G11C 7/222* (2013.01); *G11C 7/1006* (2013.01); *G11C 7/1093* (2013.01); *G11C 7/1087* (2013.01); *G11C 7/1096* (2013.01)
USPC ................................. 365/230.08; 365/233.5

(58) Field of Classification Search
USPC .......................................... 365/230.08, 233.5
See application file for complete search history.

(56) References Cited

U.S. PATENT DOCUMENTS

| | | | |
|---|---|---|---|
| 2003/0086303 A1* | 5/2003 | Jeong | 365/189.05 |
| 2005/0243644 A1* | 11/2005 | Taruishi et al. | 365/233 |
| 2006/0209619 A1 | 9/2006 | Park | |

FOREIGN PATENT DOCUMENTS

KR         1020040095396 A         11/2004

* cited by examiner

*Primary Examiner* — Vu Le
(74) *Attorney, Agent, or Firm* — William Park & Associates Patent Ltd.

(57) ABSTRACT

A data input circuit includes a clock sampling unit, a final clock generation unit, and a write latch signal generation unit. The sampling unit is configured to generate a shifting signal including a pulse generated after a write latency is elapsed, and generate a sampling clock by sampling an internal clock during a burst period from substantially a time when the pulse of the shifting signal is generated. The final clock generation unit is configured to generate a level signal by latching the shifting signal in synchronization with the sampling clock and generate a final clock from the level signal in response to a burst signal. The write latch signal generation unit is configured to generate an enable signal by latching the final clock and generate a write latch signal for latching and outputting aligned data in response to the enable signal.

15 Claims, 9 Drawing Sheets

DATA INPUT CIRCUIT

CROSS-REFERENCES TO RELATED APPLICATIONS

The present application claims priority under 35 U.S.C 119(a) to Korean Application No. 10-2010-0054316, filed on Jun. 9, 2010, in the Korean intellectual property Office, which is incorporated herein by reference in its entirety.

BACKGROUND

Exemplary embodiments of the present invention relate to a data input circuit.

As the integration density of semiconductor memory devices increases many efforts have been made to increase the operating speed of semiconductor memory devices. To increase the operating speed of semiconductor memory devices, synchronous memory devices have been introduced which can operate in synchronization with a clock supplied from the outside of a memory chip.

An early synchronous memory device is a single data rate (SDR) synchronous memory device which inputs/outputs data in synchronization with a rising edge of an external clock.

However, the SDR synchronous memory device could not sufficiently meet high-speed requirements of systems. In this regard, a double data rate (DDR) synchronous memory device has been introduced which processes data on both rising edge and falling edge of each clock cycle.

Accordingly, without increasing a frequency of a clock, the DDR synchronous memory device can implement at least two times the bandwidth of the conventional SDR synchronous memory device. Hence, the DDR synchronous memory device can better implement high-speed operations.

Meanwhile, the DDR synchronous memory device uses a multi-bit prefetch method which internally processes multi-bits at a time. The multi-bit prefetch method refers to a method which aligns successive input data in parallel in synchronization with a data strobe signal and stores multi-bit data, which are aligned by a write command inputted in synchronization with an external clock signal, in a memory cell array at a time.

Figure 1:
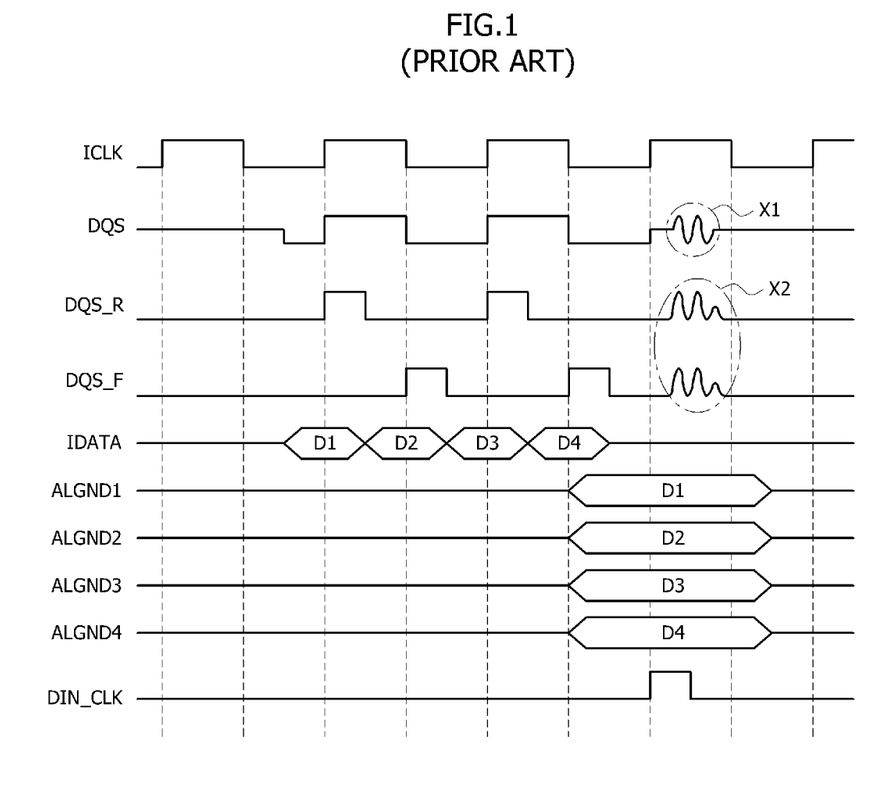
FIG. 1 is a timing diagram illustrating a conventional multi-bit prefetch method of a data input circuit.

FIG. 1 is a timing diagram illustrating a conventional multi-bit prefetch method of a data input circuit.

When a write operation is started, internal data IDATA are aligned in synchronization with a rising data strobe signal DQS_R and a falling data strobe signal DQS_F. That is, the internal data IDATA are latched in synchronization with the rising data strobe signal DQS_R and the falling data strobe signal DQS_F, and outputted as first to fourth aligned data ALGND1 to ALGND4 in synchronization with the last pulse of the falling data strobe signal DQS_F. The first to fourth aligned data ALGND1 to ALGND4 are transferred to a write driver (not shown) in synchronization with a data input clock DIN_CLK.

When the input of the internal data IDATA is completed, the data strobe signal DQS is in a precharge state during a postamble period. Meanwhile, as indicated by X1, ringing may occur in the data strobe signal DQS during the postamble. When ringing occurs in the data strobe signal DQS, ringing may also occur in the rising data strobe signal DQS_R and the falling data strobe signal DQS_F as indicated by X2. This is because the rising data strobe signal DQS_F is generated in synchronization with the rising edge of the data strobe signal DQS, and the falling data strobe signal DQS_F is generated in synchronization with the falling edge of the data strobe signal DQS.

Ringing occurring in the rising data strobe signal DQS_R and the falling data strobe signal DQS_F may latch the internal data IDATA when the internal data IDATA are not valid. Hence, the first to fourth aligned data ALGND1 to ALGND4 which are validly latched may be overwritten with invalid data, causing an error in the write operation.

SUMMARY

An embodiment of the present invention provides a data input circuit which is capable of preventing an error in a write operation caused by ringing of a data strobe signal in a postamble period.

In one embodiment, a data input circuit includes: a data alignment unit configured to align internal data in synchronization with first and second internal strobe signals to generate rising data and falling data; a data strobe signal detection circuit configured to detect a last falling edge of a data strobe signal and generate a write latch signal; and a data latch unit configured to latch the rising data and the falling data in response to the write latch signal and output latched data.

In another embodiment, a data input circuit includes: a clock sampling unit configured to generate a shifting signal including a pulse generated after a write latency is elapsed, and generate a sampling clock by sampling an internal clock during a burst period from substantially a time when the pulse of the shifting signal is generated; a final clock generation unit configured to generate a level signal by latching the shifting signal in synchronization with the sampling clock and generate a final clock from the level signal in response to a burst signal; and a write latch signal generation unit configured to generate an enable signal by latching the final clock and generate a write latch signal for latching and outputting aligned data in response to the enable signal.

In an embodiment of the invention, a data input circuit may receive a predetermined number of input data blocks synchronized to both rising and falling edges of a data strobe signal. For example, each data block may be 32 bits of data, and the predetermined number may be 4 data blocks. Accordingly, the data strobe signal may comprise two pulses, and each data block may be received via a corresponding rising edge or falling edge of the two pulses. Each pulse may correspond to a period of the data strobe signal.

A period of the data strobe signal may comprise, for example, a logic high portion of the pulse followed by a logic low portion. The received data may then be aligned so that the predetermined number of data blocks may be latched by a single trigger signal. The single trigger signal may be generated by detecting a last falling edge of the data strobe signal. The aligned data may be latched by a leading edge of the single trigger signal, where the leading edge of the single trigger signal occurs within a logic low portion of the last period of the data strobe signal. A period of the data strobe signal may start with logic high portion followed by the logic low portion.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the various embodiments are for illustrative purposes only and are not intended to limit the scope of the invention.

Figure 2:
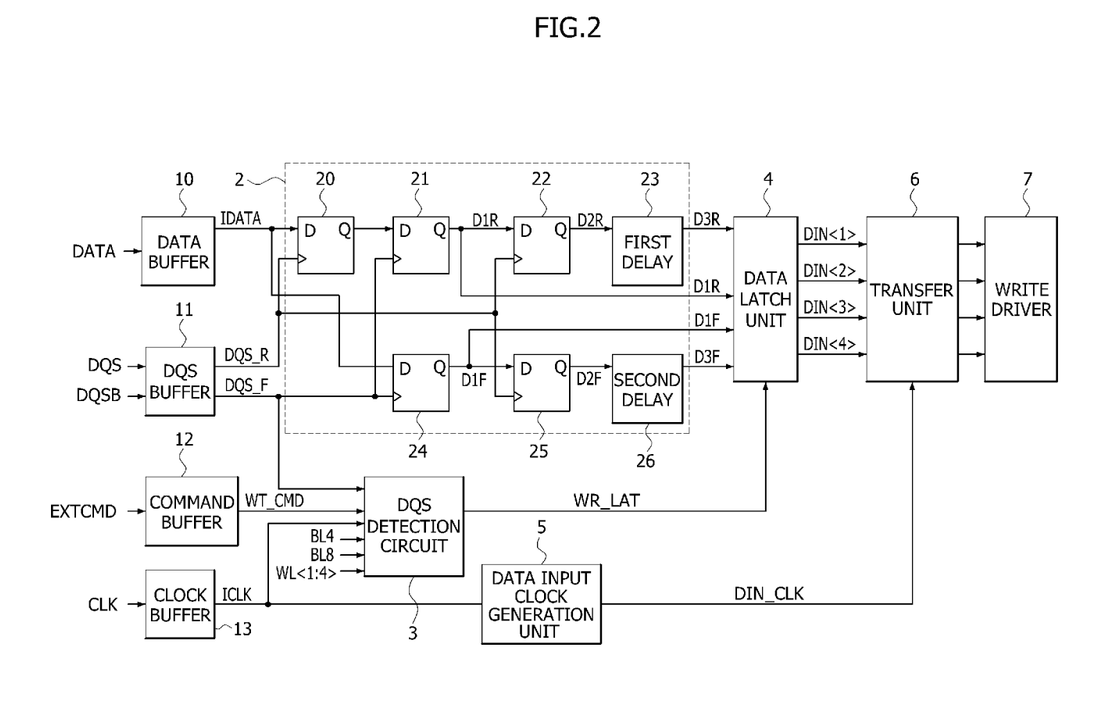
FIG. 2 is a block diagram illustrating a configuration of a data input circuit according to an embodiment of the present invention.

FIG. 2 is a block diagram illustrating a configuration of a data input circuit according to an embodiment of the present invention.

As illustrated in FIG. 2, the data input circuit according to an embodiment of the present invention includes a data buffer 10, a data strobe signal buffer 11, a command buffer 12, a clock buffer 13, a data alignment unit 2, a data strobe detection circuit 3, a data latch unit 4, a data input clock generation unit 5, a transfer unit 6, and a write driver 7.

The data buffer 10 is configured to buffer data DATA and generate internal data IDATA. The data strobe signal buffer 11 is configured to receive a data strobe signal DQS and an inverted data strobe signal DQSB and generate a first internal strobe signal DQS_R and a second internal strobe signal DQS_F. The first internal strobe signal DQS_R is generated in synchronization with a rising edge of the data strobe signal DQS, and the second internal strobe signal DQS_F is generated in synchronization with a falling edge of the data strobe signal DQS. The command buffer 12 is configured to buffer an external command EXTCMD and generate a write command WT_CMD for a write operation. The clock buffer 13 is configured to buffer a clock CLK and generate an internal clock ICLK.

The data alignment unit 2 includes a first latch 20, a second latch 21, a third latch 22, a first delay 23, a fourth latch 24, a fifth latch 25, and a second delay 26. The first latch 20 is configured to latch the internal data IDATA in synchronization with the first internal strobe signal DQS_R. The second latch 21 is configured to latch an output signal of the first latch 20 in synchronization with the second internal strobe signal DQS_F and output a first rising data D1R. The third latch 22 is configured to latch the first rising data D1R in synchronization with the first internal strobe signal DQS_R and output a second rising data D2R. The first delay 23 is configured to delay the second rising data D2R by a predetermined time and output a third rising data D3R.

The fourth latch 24 is configured to latch the internal data IDATA in synchronization with the second internal strobe signal DQS_F and output a first falling data D1F. The fifth latch 25 is configured to latch the first falling data D1F in synchronization with the first internal strobe signal DQS_R and output a second falling data D2F. The second delay 26 is configured to delay the second falling data D2F by a predetermined time and output a third falling data D3F. The first latch 20, the second latch 21, the third latch 22, the fourth latch 24, and the fifth latch 25 may be implemented with D flip-flops. In an embodiment of the invention, the first delay 23 and the second delay 26 may also be, for example, latches configured to latch data in synchronization with the second internal strobe signal.

It may be noted that a "latch" may refer generally to either an edge-triggered device or a level-triggered device.

The first rising data D1R, the third rising data D3R, the first falling data D1F, and the third falling data D3F outputted from the data alignment unit 2 are aligned and then outputted.

Figure 3:
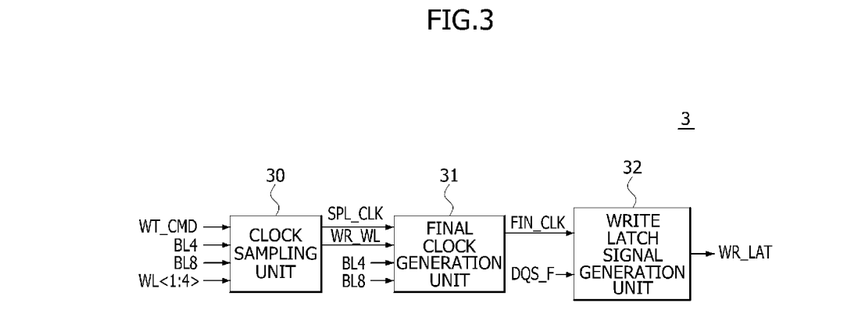
FIG. 3 is a block diagram illustrating a configuration of a data strobe signal detection circuit included in the data input circuit of FIG. 2.

As illustrated in FIG. 3, the data strobe signal detection circuit 3 includes a clock sampling unit 30, a final clock generation unit 31, and a write latch signal generation unit 32.

Figure 4:
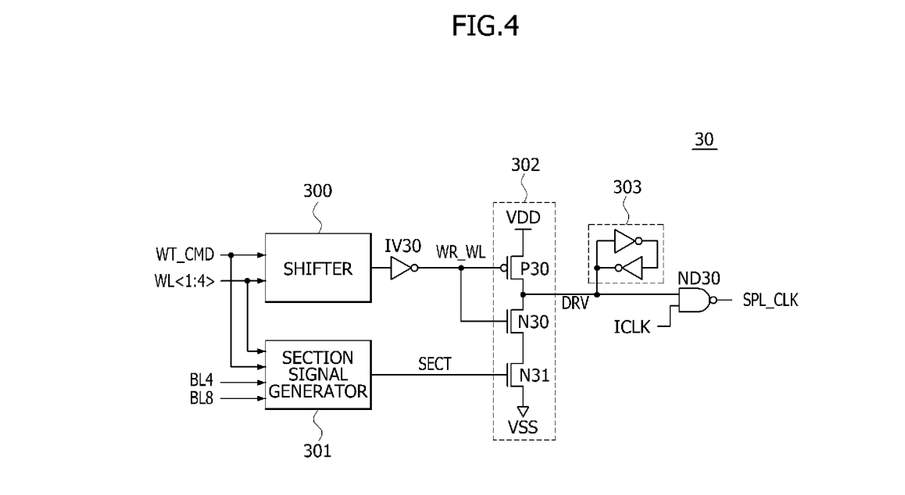
FIG. 4 is a circuit diagram illustrating a clock sampling unit included in the data strobe signal detection circuit of FIG. 3.

As illustrated in FIG. 4, the clock sampling unit 30 includes a shifter 300, an inverter IV30, a section signal generator 301, a driver 302, a latch 303, and a NAND gate ND30. The shifter 300 is configured to shift the write command WT_CMD by a write latency set by first to fourth write latency signals WL<1:4>. The inverter IV30 is configured to operate as a buffer which inverts and buffers an output signal of the shifter 300 and outputs a shifting signal WR_WL. The section signal generator 301 is configured to generate a section signal SECT. The section signal SECT is disabled to a logic low level from a time when the write command WT_CMD is inputted to a time determined by the write latency, set by the first to fourth write latency signals WL<1:4>, and a burst period, set by first and second burst signals BL4 and BL8.

The driver 302 includes a PMOS transistor P30 and NMOS transistors N30 and N31 configured to drive a driving signal DRV in response to the shifting signal WR_WL and the section signal SECT. The latch 303 is configured to latch the driving signal DRV. The NAND gate ND30 is configured to operate as a transfer element which transfers the internal clock ICLK as a sampling clock SPL_CLK in a period in which the driving signal DRV is at a logic high level.

When the first write latency signal WL<1> is at a logic high level, the write latency is set to 1. Thus, after the write command WT_CMD, the data input for the write operation is started after 1 cycle of the internal clock ICLK has elapsed. Also, when the second write latency signal WL<2> is at a logic high level, the write latency is set to 2. Thus, after the write command WT_CMD, the data input for the write operation is started after 2 cycles of the internal clock ICLK have elapsed. Meanwhile, when the first burst signal BL4 is at a logic high level, the burst period in which data are successively inputted is set to 4 cycles of the internal clock ICLK. When the second burst signal BL8 is at a logic high level, the burst period is set to 8 cycles of the internal clock ICLK.

Figure 5:
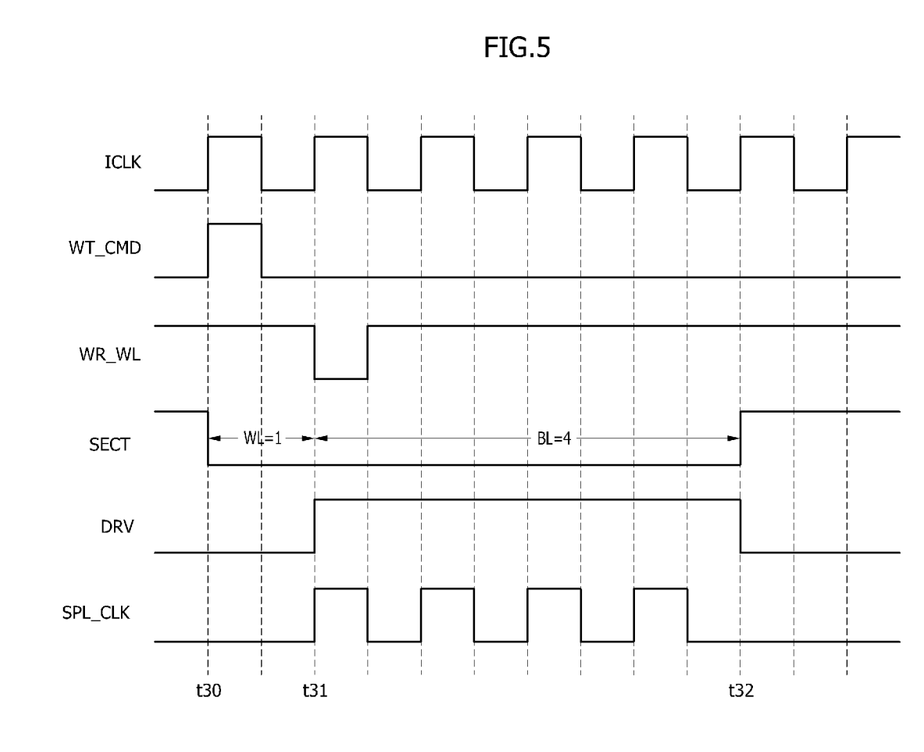
FIG. 5 is a timing diagram illustrating the operation of the clock sampling unit of FIG. 4.

The operation of the clock sampling unit 30 will be described below with reference to FIG. 5. It is assumed that the first write latency signal WL<1> is set to a logic high level, and the first burst signal BL4 is set to a logic high level.

When the write command WT_CMD is inputted at time t30, the shifter 300 shifts the write command WT_CMD by 1 cycle of the internal clock ICLK. Thus, the inverter IV30 outputs the shifting signal WR_WL at time t31.

At this time, the section signal SECT generated from the section signal generator 301 is disabled to a logic low level from time t30 when the write command WT_CMD is inputted to time t32 at which the write latency (1 cycle of the internal clock ICLK) and the burst period (4 cycles of the internal clock ICLK) are elapsed.

The PMOS transistor P30 of the driver 302 is turned on and the NMOS transistor N30 is turned off at time 31 when a logic low level pulse of the shifting signal WR_WL is inputted, allowing the driver 302 to pull-up drive the driving signal DRV. When both the shifting signal WR_WL and the section signal SECT are at logic high at time t32, the NMOS transistors N30 and N31 of the driver 302 pull-down drive the driving signal DRV. Therefore, during the time from approximately t31 to approximately t32 when the driving signal DRV is driven to a logic high level, the internal clock ICLK is transferred to generate the sampling clock SPL_CLK.

Figure 6:
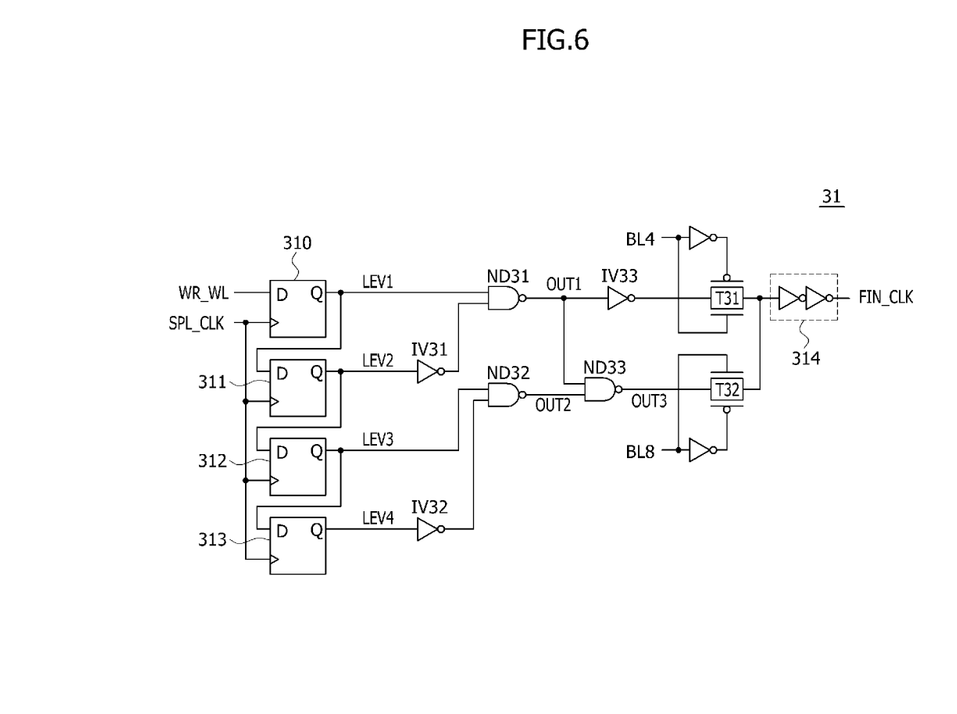
FIG. 6 is a circuit diagram illustrating a final clock generation unit included in the data strobe signal detection circuit of FIG. 3.

As illustrated in FIG. 6, the final clock generation unit 31 includes a first level signal generator 310, a second level signal generator 311, a third level signal generator 312, a fourth level signal generator 313, an inverter IV31, a NAND gate ND31, an inverter IV32, a NAND gate ND32, an inverter IV33, a NAND gate ND33, a transfer gate T31, a transfer gate T32, and a buffer 314.

The first level signal generator 310 is configured to latch the shifting signal WR_WL in synchronization with the sampling clock SPL_CLK and generate a first level signal LEV1. The second level signal generator 311 is configured to latch the first level signal LEV1 in synchronization with the sampling clock SPL_CLK and generate a second level signal LEV2. The third level signal generator 312 is configured to latch the second level signal LEV2 in synchronization with the sampling clock SPL_CLK and generate a third level signal LEV3. The fourth level signal generator 313 is configured to latch the third level signal LEV3 in synchronization with the sampling clock SPL_CLK and generate a fourth level signal LEV4. The inverter IV31 is configured to invert the second level signal LEV2.

The NAND gate ND31 is configured to perform a NAND operation on the first level signal LEV1 and an output signal of the inverter IV31 and generate a first output signal OUT1. The inverter IV32 is configured to invert the fourth level signal LEV4. The NAND gate ND32 is configured to perform a NAND operation on the third level signal LEV3 and an output signal of the inverter IV32 and generate a second output signal OUT2. The inverter IV33 is configured to invert the first output signal OUT1. The NAND gate ND33 is configured to perform a NAND operation on the first output signal OUT1 and the second output signal OUT2 and generate a third output signal OUT3.

The transfer gate T31 is configured to transfer an output signal of the inverter IV33 when the first burst signal BL4 is at a logic high level. The transfer gate T32 is configured to transfer an output signal of the NAND gate ND33 when the second burst signal BL8 is at a logic high level. The buffer 314 is configured to buffer the signal from the transfer gates T31 and T32 and transfer the buffered signal as a final clock FIN_CLK. The first to fourth level signal generators 310 to 313 may be implemented with, for example, D flip-flops.

Figure 7:
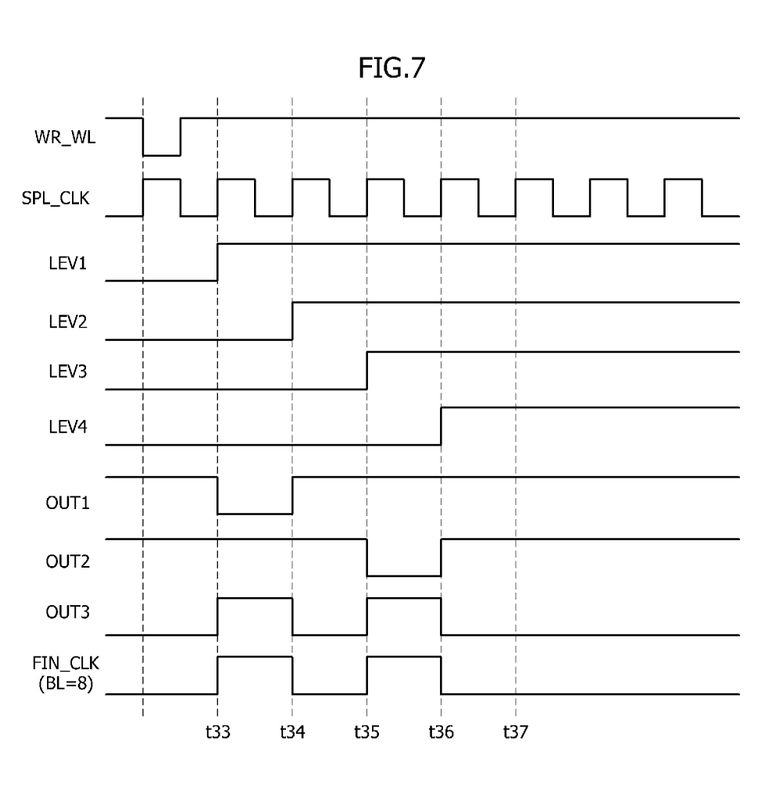
FIG. 7 is a timing diagram illustrating the operation of the final clock generation unit of FIG. 6.

The operation of the final clock generation unit 31 will be described below with reference to FIG. 7. It is assumed that the second burst signal BL8 is set to a logic high level.

After a logic low level pulse of the shifting signal WR_WL is inputted, the first level signal generator 310 generates the first level signal LEV1 which changes to a logic high level at time t33 at a rising edge of the sampling clock SPL_CLK. Also, the second to fourth level signal generators 311 to 313 generate the second to fourth level signals LEV2 to LEV4 which change to a logic high level in synchronization with the subsequent rising edges of the sampling clock SPL_CLK at times t34, t35, and t36, respectively. The first output signal OUT1 outputted from the NAND gate ND31 is at a logic low level from time t33 when the first level signal LEV1 changes to a logic high level to time t34 when the second level signal LEV2 changes to a logic high level.

Also, the second output signal OUT2 is at a logic low level from time t35 when the third level signal LEV3 changes to a logic high level to time t36 when the fourth level signal LEV4 changes to a logic high level. The third output signal OUT3 corresponds to the first output signal OUT1 and the second output signal OUT2. As assumed above, the transfer gate T32 is turned on by the second burst signal BL8 of the logic high level, and the third output signal OUT3 is buffered and outputted as the final clock FIN_CLK. Therefore, the final clock FIN_CLK is generated during a period from time t33 to time t36.

Figure 8:
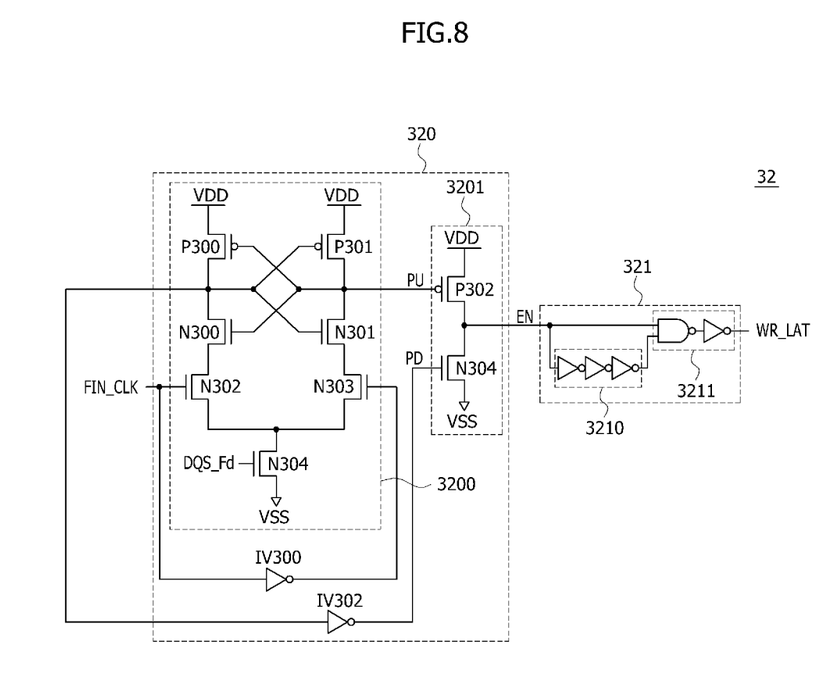
FIG. 8 is a circuit diagram illustrating a write latch signal generation unit included in the data strobe signal detection circuit of FIG. 3.

As illustrated in FIG. 8, the write latch signal generation unit 32 includes an enable signal generator 320 and a pulse generator 321. The enable signal generator 320 is configured to latch the final clock FIN_CLK and generate an enable signal EN. The pulse generator 321 is configured to generate a write latch signal WR_LAT in response to the enable signal.

The enable signal generator 320 includes a clock latch 3200 and an enable signal driver 3201. The clock latch 3200 is configured to latch the final clock FIN_CLK when a delayed internal strobe signal DQS_Fd of a logic high level is inputted, and generate a pull-up signal PU and a pull-down signal PD. The enable signal driver 3201 is configured to drive the enable signal in response to the pull-up signal PU and the pull-down signal PD. The delayed internal strobe signal DQS_Fd is generated by delaying the second internal strobe signal DQS_F by a predetermined time. The enable signal generator 320 latches the final clock FIN_CLK of a logic high level when the delayed internal strobe signal DQS_Fd of a logic high level is inputted, and generates the pull-up signal PU and the pull-down signal PD. Thus, the enable signal EN is driven to a logic low level. The enable signal EN driven to the logic low level changes to a logic high level when the delayed internal strobe signal DQS_Fd or the final clock FIN_CLK changes to a logic low level.

The pulse generator 321 includes an inversion delay 3210 and a logic 3211. The inversion delay 3210 is configured to invert and delay the enable signal EN. The logic 3211 is configured to perform an AND operation on the enable signal EN and an output signal of the inversion delay 3210, and generate the write latch signal WR_LAT. The write latch signal WR_LAT is enabled to a logic high level during a delay time of the inversion delay 3210 from the timing at which the enable signal EN changes to a logic high level.

Figure 9:
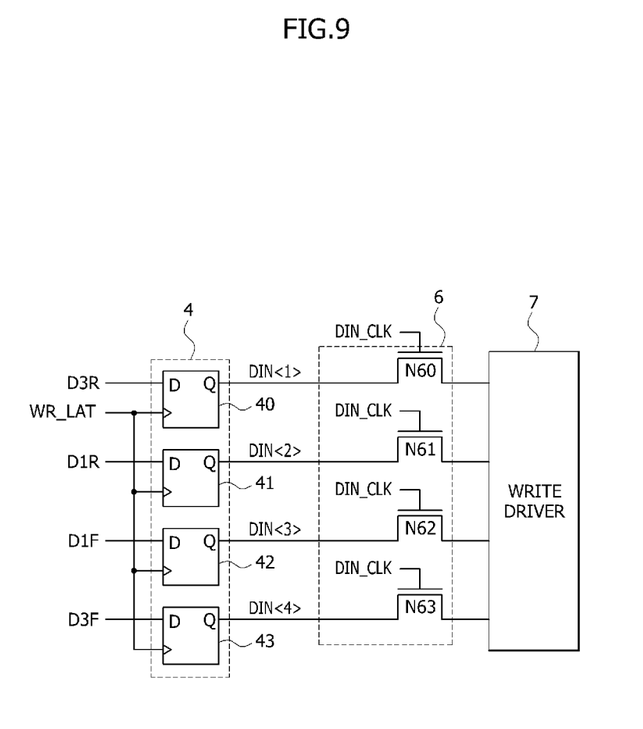
FIG. 9 is a detailed circuit diagram illustrating a data latch unit and a transfer unit included in the data input circuit of FIG. 2.

As illustrated in FIG. 9, the data latch unit 4 includes a first data latch 40, a second data latch 41, a third data latch 42, a fourth data latch 43. The first data latch 40 is configured to latch the third rising data D3R in synchronization with the write latch signal WR_LAT and generate the first input data DIN<1>. The second data latch 41 is configured to latch the first rising data D1R in synchronization with the write latch signal WR_LAT and generate the second input data DIN<1>. The third data latch 42 is configured to latch the first falling data D1F in synchronization with the write latch signal WR_LAT and generate the third input data DIN<3>. The fourth data latch 43 is configured to latch the third falling data D3F in synchronization with the write latch signal WR_LAT and generate the fourth input data DIN<4>. The first to fourth data latches 40 to 43 may be implemented with, for example, D flip-flops.

The data latch unit 4 latches the third rising data D3R, the first rising data D1R, the first falling data D1F, and the third falling data D3F in synchronization with the rising edge of the write latch signal WR_LAT, and outputs the first to fourth input data DIN<1:4>. Therefore, the first to fourth input data DIN<1:4> are outputted as a signal which has a pulse width during 2 cycles of the internal clock ICLK from the rising edge of the write latch signal WR_LAT. This is because the cycle of the final clock FIN_CLK generating the write latch signal WR_LAT corresponds to 2 cycles of the internal clock ICLK.

The data input clock generation unit 5 generates the data input clock DIN_CLK by delaying the internal clock ICLK by a predetermined time. Since the generation section of the data input clock DIN_CLK is determined according to the specification, the delay section of the data input clock generation unit 5 may be set accordingly.

As illustrated in FIG. 9, the transfer unit 6 includes NMOS transistors N60 to N63. The NMOS transistors N60 to N63 are configured to operate as transfer elements which transfer the first to fourth input data DIN<1:4> to the write driver 7 in synchronization with the data input clock DIN_CLK.

The operation of the data input circuit having the structure described above with reference to FIGS. 1 to 8 will be described with reference to FIG. 10. It is assumed that the first write latency signal WL<1> is set to a logic high level, and the first burst signal BL4 is set to a logic high level.

First, the data buffer 10 buffers the data DATA and generates the internal data IDATA, and the data strobe signal buffer 11 receives the data strobe signal DQS and the inverted data strobe signal DQSB, and generates the first internal strobe signal DQS_R and the second internal strobe signal DQS_F. The command buffer 12 buffers the external command EXTCMD and generates the write command WT_CMD for the write operation. The clock buffer 13 buffers the clock CLK and generates the internal clock ICLK.

Then, the data alignment unit 2 sequentially latches the internal data IDATA in synchronization with the first internal strobe signal DQS_R and the second internal strobe signal DQS_F, and aligns the first rising data D1R, the third rising data D3R, the first falling data D1F, and the third falling data D3F at time t5.

The data strobe signal detection circuit 3 detects the final falling edge of the second internal strobe signal DQS_F and generates the final clock FIN_CLK including a pulse generated at a logic high level from time t4 to time t6. This is because the first write latency signal WL<1> is at a logic high level and thus the internal clock ICLK is outputted as the sampling clock SPL_CLK from time t2, and the first burst signal BL4 is at a logic high level and thus the pulse having the pulse width of the logic high level during 1 cycle of the internal clock ICLK from time t4 is selected and outputted by the final clock generator 31.

Also, the write latch signal generation unit 32 of the data strobe signal detection circuit 3 latches the final clock FIN_CLK in synchronization with the delayed internal strobe signal DQS_Fd and generates the write latch signal WR_LAT. The write latch signal WR_LAT is generated in synchronization with the last falling edge of the delayed internal strobe signal DQS_Fd.

The data latch unit 4 latches the third rising data D3R, the first rising data D1R, the first falling data D1F, and the third falling data D3F in synchronization with the rising edge of the write latch signal WR_LAT and generates the first to fourth input data DIN<1:4>.

The transfer unit 6 transfers the first to fourth input data DIN<1:4> to the write driver 7 in synchronization with the data input clock DIN_CLK.

As described above, the data input circuit according to the embodiment of the present invention detects the last pulse of the second internal strobe signal DQS_F to generate the write latch signal WR_LAT, latches the third rising data D3R, the first rising data D1R, the first falling data D1F, and the third falling data D3F in synchronization with the rising edge of the write latch signal WR_LAT, and outputs the first to fourth input data DIN<1:4>. At this time, the write latch signal WR_LAT is generated from the final clock FIN_CLK including the pulse generated in the end section of the data input for the write operation based on the information on the write latency and the burst period. Therefore, the write latch signal WR_LAT is not influenced by ringing Y1 of the data strobe signal DQS in the postamble period after time t6 at which the input of the data strobe signal DQS is completed. That is, even though ringing Y2 is generated in the first internal strobe signal DQS_R and the second internal strobe signal DQS_F due to the ringing Y1 of the data strobe signal DQS, the write latch signal WR_LAT generated by latching the final clock FIN_CLK is not influenced by the ringing Y1 of the data strobe signal DQS and the ringing Y2 of the first internal strobe signal DQS_R and the second internal strobe signal DQS_R.

Also, since the write latch signal WR_LAT is generated from the final clock FIN_CLK having the period corresponding to 2 cycles of the internal clock ICLK, the write latch signal WR_LAT also has the period corresponding to 2 cycles of the internal clock ICLK. Thus, the first to fourth input data DIN<1:4> outputted in synchronization with the write latch signal WR_LAT are outputted from the data latch unit 4 as the signals having the pulse width corresponding to 2 cycles of the internal clock ICLK. Consequently, when the transfer unit 6 outputs the first to fourth input data DIN<1:4> in synchronization with the data input clock DIN_CLK, a margin can be sufficiently ensured.

Figure 10:
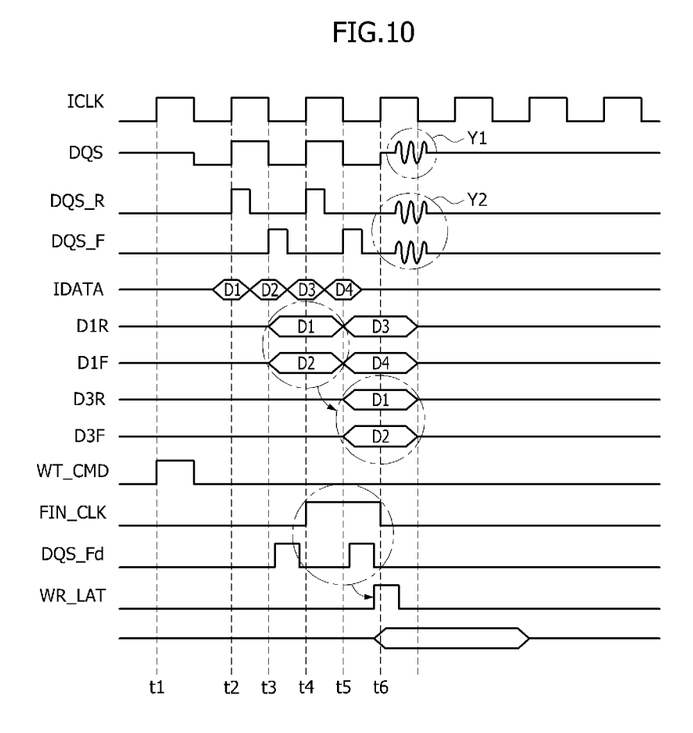
FIG. 10 is a timing diagram illustrating the operation of the data input circuit of FIG. 2.

Referring to FIG. 10, a simplified description is provided below. The data alignment unit 2 may receive a predetermined number of input data blocks, for example, four input data blocks, synchronized to both rising and falling edges of a data strobe signal DQS. While a size of the data block may be design/implementation dependent, an exemplary data block may be 8, 16, 32, or 64 bits of data. Accordingly, the data strobe signal may comprise two pulses, and each data block D1, D2, D3, and D4 may be received via a corresponding rising edge or falling edge of the two pulses at times t2, t3, t4, and t5, respectively.

Each pulse may correspond to a period of the data strobe signal. A period of the data strobe signal may comprise, for example, a logic high portion of the pulse followed by a logic low portion. Therefore, the data strobe signal DQS may comprise a first period from time t2 to t4, and a second period from time t4 to t6.

The received data D1, D2, D3, and D4 may then be aligned at substantially time t5 so that they may be latched by a single trigger signal, the write latch signal WR_LAT. The write latch signal WR_LAT may be generated by the write latch signal generation unit 32 when the data strobe detection circuit 3 detects a last falling edge of the data strobe signal DQS.

The aligned data D1, D2, D3, and D4 may be latched by a leading edge of the write latch signal WR_LAT at a time instant prior to time t6. Accordingly, the leading edge of the write latch signal WR_LAT occurs within a logic low portion from time t5 to time t6 of the last period of the write latch signal WR_LAT.

In order to avoid too much complexity, various functional descriptions may not have explicitly stated the presence of a delay from the occurrence of one event to a subsequent event. However, it may be noted that there is a finite propagation delay through any electronic device or element.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A data input circuit comprising:
   a data alignment unit configured to align internal data in synchronization with first and second internal strobe signals to generate rising data and falling data;
   a data strobe signal detection circuit configured to detect a last falling edge of a data strobe signal and generate a write latch signal; and
   a data latch unit configured to latch the rising data and the falling data in response to the write latch signal and output latched data.

2. The data input circuit of claim 1, wherein the first internal strobe signal is generated in synchronization with a rising edge of the data strobe signal, and the second internal strobe signal is generated in synchronization with a falling edge of the data strobe signal.

3. The data input circuit of claim 1, wherein the data alignment unit comprises:
   a first latch configured to latch the internal data in synchronization with the first internal strobe signal;
   a second latch configured to latch an output signal of the first latch in synchronization with the second internal strobe signal and output a first rising data;
   a third latch configured to latch the first rising data in synchronization with the first internal strobe signal and output a second rising data; and
   a first delay configured to delay the second rising data by a predetermined time and output a third rising data.

4. The data input circuit of claim 3, wherein the data alignment unit comprises:
   a fourth latch configured to latch the internal data in synchronization with the second internal strobe signal and output a first falling data;
   a fifth latch configured to latch the first falling data in synchronization with the first internal strobe signal and output a second falling data; and
   a second delay configured to delay the second falling data by a predetermined time and output a third falling data.

5. The data input circuit of claim 1, wherein the data strobe signal detection circuit comprises:
   a clock sampling unit configured to generate a shifting signal including a pulse generated after the elapse of a write latency, and generate a sampling clock by sampling an internal clock during a burst period from substantially a time when the pulse of the shifting signal is generated;
   a final clock generation unit configured to generate a level signal by latching the shifting signal in synchronization with the sampling clock, and generate a final clock from the level signal in response to a burst signal; and
   a write latch signal generation unit configured to generate an enable signal by latching the final clock, and generate the write latch signal in response to the enable signal.

6. The data input circuit of claim 5, wherein the clock sampling unit comprises:
   a shifter configured to shifting a write command by the write latency in response to a write latency signal;
   a buffer configured to buffer an output signal of the shifter and generate the shifting signal;
   a section signal generator configured to receive the write command, the write latency signal, and the burst signal and generate a section signal;
   a driver configured to drive a driving signal in response to the shifting signal and the section signal; and
   a transfer element configured to transfer the internal clock as the sampling clock in response to the driving signal.

7. The data input circuit of claim 6, wherein the section signal is driven to a logic low state from substantially a time when the write command is inputted to substantially a time determined by the write latency signal and the burst signal.

8. The data input circuit of claim 6, wherein the driver is configured to pull-up drive the driving signal from substantially a time when the pulse of the shifting signal is inputted to substantially a time when the section signal is enabled.

9. The data input circuit of claim 8, wherein the transfer element is configured to transfer the internal clock as the sampling clock while the driving signal is being pull-up driven.

10. The data input circuit of claim 5, wherein the final clock generation unit comprises:
    a first level signal generator configured to latch the shifting signal in synchronization with the sampling clock and generate a first level signal;
    a second level signal generator configured to latch the first level signal in synchronization with the sampling clock and generate a second level signal;
    a first logic element configured to generate a first output signal having a pulse width from substantially a time when a level of the first level signal changes to substantially a time when a level of the second level signal changes; and
    a first transfer element configured to buffer and transfer an output signal of the first logic element in response to a first burst signal.

11. The data input circuit of claim 10, wherein the final clock generation unit further comprises:
    a third level signal generator configured to latch the second level signal in synchronization with the sampling clock and generate a third level signal;
    a fourth level signal generator configured to latch the third level signal in synchronization with the sampling clock and generate a fourth level signal;
    a second logic element configured to generate a second output signal having a pulse width from substantially a time when a level of the third level signal changes to substantially a time when a level of the fourth level signal changes; and
    a second transfer element configured to buffer and transfer an output signal of the second logic level in response to a second burst signal.

12. The data input circuit of claim 5, wherein the write latch signal generation unit comprises:
    a clock latch configured to latch the final clock in response to the second internal strobe signal and generate a pull-up signal and a pull-down signal; and
    an enable signal driver configured to drive the enable signal in response to the pull-up signal and the pull-down signal.

13. The data input circuit of claim 12, wherein the clock latch is configured to latch the final clock in a period at which a pulse of a delayed internal strobe signal generated by delaying the second internal strobe signal is inputted.

14. The data input circuit of claim 1, further comprising:
a data input clock generation unit configured to delay an internal clock by a predetermined time and generate a data input clock; and
a transfer unit configured to transfer the latched data to a write driver in synchronization with the data input clock.

15. A method comprising:
receiving a predetermined number of input data blocks synchronized to both rising and falling edges of a data strobe signal;
aligning the received data;
generating a single trigger signal from detection of a last falling edge; and
latching the aligned received data on a leading edge of the single trigger signal, wherein a period of the data strobe signal starts with a leading edge of the data strobe signal and the leading edge of the single trigger signal occurs within a last period of the data strobe signal.

* * * * *